United States Patent
Ma

(10) Patent No.: US 10,283,211 B2
(45) Date of Patent: May 7, 2019

(54) SHIFT REGISTER UNIT AND DRIVING METHOD THEREOF, SHIFT REGISTER AND DISPLAY APPARATUS

(71) Applicant: BOE TECHNOLOGY GROUP CO., LTD., Beijing (CN)

(72) Inventor: Zhanjie Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 209 days.

(21) Appl. No.: 15/321,887

(22) PCT Filed: Apr. 7, 2016

(86) PCT No.: PCT/CN2016/078730
§ 371 (c)(1),
(2) Date: Dec. 23, 2016

(87) PCT Pub. No.: WO2016/184269
PCT Pub. Date: Nov. 24, 2016

(65) Prior Publication Data
US 2017/0140836 A1    May 18, 2017

(30) Foreign Application Priority Data
May 21, 2015  (CN) .......................... 2015 1 0263844

(51) Int. Cl.
*G11C 19/00*        (2006.01)
*G11C 19/28*        (2006.01)
(Continued)

(52) U.S. Cl.
CPC ............... *G11C 19/28* (2013.01); *G09G 3/20* (2013.01); *G09G 5/00* (2013.01); *G09G 2300/04* (2013.01);
(Continued)

(58) Field of Classification Search
None
See application file for complete search history.

(56) References Cited

U.S. PATENT DOCUMENTS 9,443,464 B2 *  9/2016  Song ................... G09G 3/3266
2013/0222352 A1 *  8/2013  Jeong ................. G09G 3/3266
                                                           345/205
(Continued)

FOREIGN PATENT DOCUMENTS

CN         1758321 A     4/2006
CN       101939791 A     1/2011
(Continued)

OTHER PUBLICATIONS

International Search Report and Written Opinion dated Jul. 14, 2016; PCT/CN2016/078730.

*Primary Examiner* — Tuan T Lam
(74) *Attorney, Agent, or Firm* — Ladas & Parry LLP

(57) ABSTRACT

Disclosed are a shift register unit and a driving method thereof, a shift register and a display device. The shift register unit comprises: an input module (P1), which connected to a first clock signal end (Clk1), a second clock signal end (Clk2) and a data carry signal end (STV) and is used for providing a selection signal according to signals input via the first clock signal end (Clk1), the second clock signal end (Clk2) and the data carry signal end (STV); and an output module (P2), which is connected to a high level end (VGH), a low level end (VGL), and an output end (Output) of the shift register unit and is used for selectively outputting a high level or a low level at the output end (Output) according to the selection signal provided by the input module (P1). The shift register comprises a plurality of stages of shift register units, and the display device comprises a shift register. The normal operation of a shift register (Continued)

unit can be ensured by utilizing only one stage of circuit, so that a circuit structure of the shift register unit is simplified.

11 Claims, 3 Drawing Sheets

(51) Int. Cl.
 *G09G 5/00* (2006.01)
 *G09G 3/20* (2006.01)
(52) U.S. Cl.
 CPC .............. *G09G 2310/0267* (2013.01); *G09G 2310/0286* (2013.01)

(56) References Cited

U.S. PATENT DOCUMENTS

| | | | | |
|---|---|---|---|---|
| 2016/0105184 | A1* | 4/2016 | Qian | H03K 19/0944 345/214 |
| 2016/0293090 | A1* | 10/2016 | Long | G09G 3/2092 |
| 2016/0314745 | A1* | 10/2016 | Hu | G09G 3/3266 |
| 2016/0329015 | A1* | 11/2016 | Ji | G09G 3/32 |
| 2016/0372041 | A1* | 12/2016 | Sun | G09G 3/20 |
| 2016/0379558 | A1* | 12/2016 | Jeon | G09G 3/3225 345/213 |
| 2017/0004889 | A1* | 1/2017 | Li | G11C 19/28 |
| 2017/0278450 | A1* | 9/2017 | Ma | G09G 3/2092 |
| 2017/0330633 | A1* | 11/2017 | Sun | G11C 19/186 |
| 2018/0047344 | A1* | 2/2018 | Sun | G09G 3/34 |

FOREIGN PATENT DOCUMENTS

| | | |
|---|---|---|
| CN | 102467890 A | 5/2012 |
| CN | 103606350 A | 2/2014 |
| CN | 104835531 A | 8/2015 |
| TW | 201035981 A | 10/2010 |

* cited by examiner

SHIFT REGISTER UNIT AND DRIVING METHOD THEREOF, SHIFT REGISTER AND DISPLAY APPARATUS

TECHNICAL FIELD

The present disclosure relates to a shift register unit and a driving method thereof, a shift register and a display apparatus.

BACKGROUND

Upon displaying, a display apparatus needs to utilize a shift register to realize scanning a pixel unit. The shift register comprises multiple stages of shift register units, each of which is corresponding to pixel units of one row. Progressive scanning of pixel units in the display apparatus is realized by multiple stages of shift register units, so as to display an image.

In the prior art, each stage of shift register unit comprises two stages of circuits. There are a larger number of transistors used in the shift register unit such that a structure of the shift register unit is complicated.

SUMMARY

There are provided in the present disclosure a shift register unit and a driving method thereof, a shift register and a display apparatus, which are used to simplify a structure of a circuit of the shift register unit under the premise that the shift register unit is ensured to operate normally.

There is provided according to one aspect of the present disclosure a shift register unit, comprising: an input module, connected to a first clock signal terminal, a second clock signal terminal and a data carry signal terminal and configured to provide a selection signal according to signals input by the first clock signal terminal, the second clock signal terminal and the data carry signal terminal; an output module, connected to a high level terminal, a low level terminal, and an output terminal of the shift register unit and configured to select to output a high level signal or a low level signal at the output terminal according to the selection signal provided by the input module.

Alternatively, in the shift register unit, the input module can comprise a first transistor, a second transistor, a third transistor, a fourth transistor and a first capacitor. A gate of the first transistor is connected to the first clock signal terminal, a gate of the second transistor and a drain of the third transistor, a source thereof is connected to a gate of the third transistor, a gate of a fifth transistor, a gate of the sixth transistor and a first terminal of a second capacitor, and a drain thereof is connected to the data carry signal terminal; a source of the second transistor is connected to the low level terminal, and a drain thereof is connected to a source of the fourth transistor, a source of the third transistor and a first terminal of the first capacitor; the drain of the third transistor is connected to the first clock signal terminal; a gate of the fourth transistor is connected to the second clock signal terminal and a second terminal of the first capacitor, a source thereof is connected to the first terminal of the first capacitor, and a drain thereof is connected to a drain of the fifth transistor, a gate of a seventh transistor and a second terminal of a third capacitor.

Alternatively, in the shift register unit, the output module can comprise the fifth transistor, the sixth transistor, the seventh transistor, the second capacitor and the third capacitor. The gate of the fifth transistor is connected to the first terminal of the second capacitor and the gate of the sixth transistor, a source thereof is connected to a first terminal of the third capacitor, a drain of the seventh transistor and the high level terminal, and the drain thereof is connected to the second terminal of the third capacitor and the gate of the seventh transistor; the gate of the sixth transistor is connected to the first terminal of the second capacitor, a source thereof is connected to the low level terminal, and a drain thereof is connected to a second terminal of the second capacitor, a source of the seventh transistor and the output terminal of the shift register unit; the gate of the seventh transistor is connected to the second terminal of the third capacitor, the source thereof is connected to the second terminal of the second capacitor and the output terminal of the shift register unit, and the drain thereof is connected to the first terminal of the third capacitor and the high level terminal.

There is further provided according to a second aspect of the present disclosure a driving method of a shift register unit, comprising:

in a first phase, both a signal of a data carry signal terminal and a signal of a first clock signal terminal are low level signals, a signal of a second clock signal terminal is a high level signal, and the signal of the data carry signal terminal and the signal of the first clock signal terminal turn on the sixth transistor and charge a second capacitor, such that an output of the shift register unit is a low level signal;

in a second phase, both the signal of the first clock signal terminal and the signal of the second clock signal terminal are high level signals, the signal of the data carry signal terminal is the low level signal, and the second capacitor provides the low level signal maintained in the first phase to a sixth transistor, and the sixth transistor is turned on, such that the output of the shift register unit is the low level signal;

in a third phase, the signal of the first clock signal terminal is the high level signal, both the signal of the second clock signal terminal and the signal of the data carry signal terminal are low level signals, a high level signal of a high level terminal charges a third capacitor, and the second capacitor provides the low level signal maintained in the second phase to the sixth transistor, and the sixth transistor is turned on, such that the output of the shift register unit is the low level signal;

in a fourth phase, both the signal of the second clock signal terminal and the signal of the data carry signal terminal are high level signals, the signal of the first clock signal terminal is the low level signal, the signal of the data carry signal terminal and the signal of the first clock signal terminal turn off the sixth transistor and charges the second capacitor, the third capacitor provides the high level signal maintained in the third phase to a seventh transistor, and the seventh transistor is turned off, and an equivalent capacitance of the output terminal of the shift register unit makes that the output of the shift register unit is the high level signal;

in a fifth phase, both the signal of the first clock signal terminal and the signal of the data carry signal terminal are high level signals, the signal of the second clock signal terminal is the low level signal, the second capacitor provides the high level signal maintained in the fourth phase to the sixth transistor, and the sixth transistor is turned off, a bootstrapping function of a first capacitor makes that a source of a fourth transistor is the low level signal, the fourth transistor is turned on to charge the third capacitor, and the seventh transistor is turned on, such that the output of the shift register unit is the high level signal;

in a sixth phase, both the signal of the second clock signal terminal and the signal of the data carry signal terminal are high level signals, the signal of the first clock signal terminal is the low level signal, the signal of the data carry signal terminal and the signal of the first clock signal terminal turn off the sixth transistor, the signal of the data carry signal terminal charges the second capacitor through a first transistor, the low level terminal charges the first capacitor through a second transistor, the third capacitor provides the low level signal maintained in the fifth phase to the seventh transistor, and the seventh transistor is turned on, such that the output of the shift register is the high level signal;

in a seventh phase, the signal of the first clock signal terminal is the high level signal, both the signal of the second clock signal terminal and the signal of the data carry signal terminal are low level signals, the second capacitor provides the high level signal maintained in the sixth phase to the sixth transistor, and the sixth transistor is turned off, the low level signal of the second clock signal terminal turns on the fourth transistor, the first capacitor provides the low level signal maintained in the sixth phase to the seventh transistor, and the seventh transistor is turned on, such that the output of the shift register unit is the high level signal.

There is further provided according to a third aspect of the present disclosure a shift register, comprising multiple stages of shift register units as described in the above technical solutions;

except for a first stage of shift register unit, a data carry signal terminal of each of remaining stages of shift register units is connected to a present stage output terminal of an adjacent previous stage of shift register unit;

except for a last stage of shift register unit, the output terminal of the present stage of each of remaining stages of shift register units is connected to a data carry signal terminal of an adjacent next stage of shift register unit.

There is further provided in a fourth aspect of the present disclosure a display apparatus, comprising the shift register as described in the above technical solution.

In the shift register unit and the driving method thereof, the shift register and the display apparatus provided in the present disclosure, each stage of shift register unit only includes one stage of circuit, and this one stage of circuit comprises 7 transistors and 3 capacitors. Compared with the shift register unit in the prior art which can operate normally only when two stages of circuits are arranged and the two stages of circuits comprise 12 transistors and 3 capacitors totally, the shift register unit in the present disclosure can ensure the normal operation of the shift register unit by utilizing only the one stage of circuit comprising 7 transistors and 3 capacitors, so that the structure of the circuit of the shift register unit is simplified.

DETAILED DESCRIPTION

In order to further describe a shift register unit and a driving method thereof, a shift register and a display apparatus provided in embodiments of the present disclosure, description is given in detail by combining with figures. Exemplary embodiments of the present disclosure and their descriptions are used to explain the present disclosure, and do not form limitations to the present disclosure.

Figure 1:
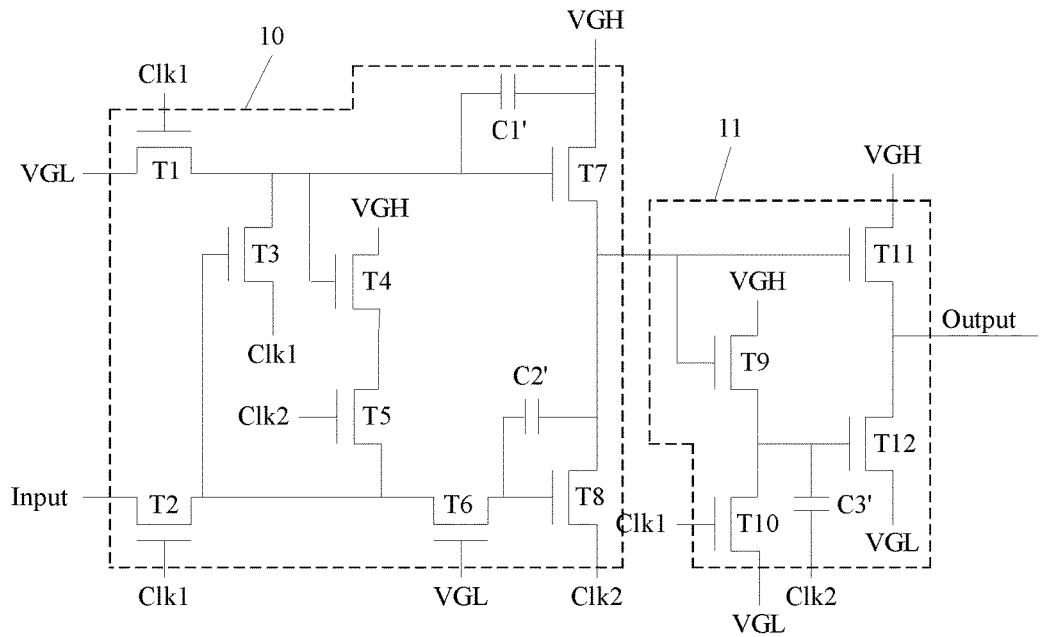
FIG. 1 is a schematic diagram of a structure of a known shift register unit.

FIG. 1 shows a schematic diagram of a structure of a known shift register unit. As shown in FIG. 1, each stage of shift register unit comprises two stages of circuits. A first stage circuit 10 is a signal triggering electrode circuit, and a second stage circuit 11 is a normally-open output circuit. The first stage circuit 10 comprises 8 transistors and 2 capacitors. The second stage circuit 11 comprises 4 transistors and 1 capacitor. There are a larger number of transistors in the shift register unit such that the structure of the shift register unit is complicated.

Figure 2:
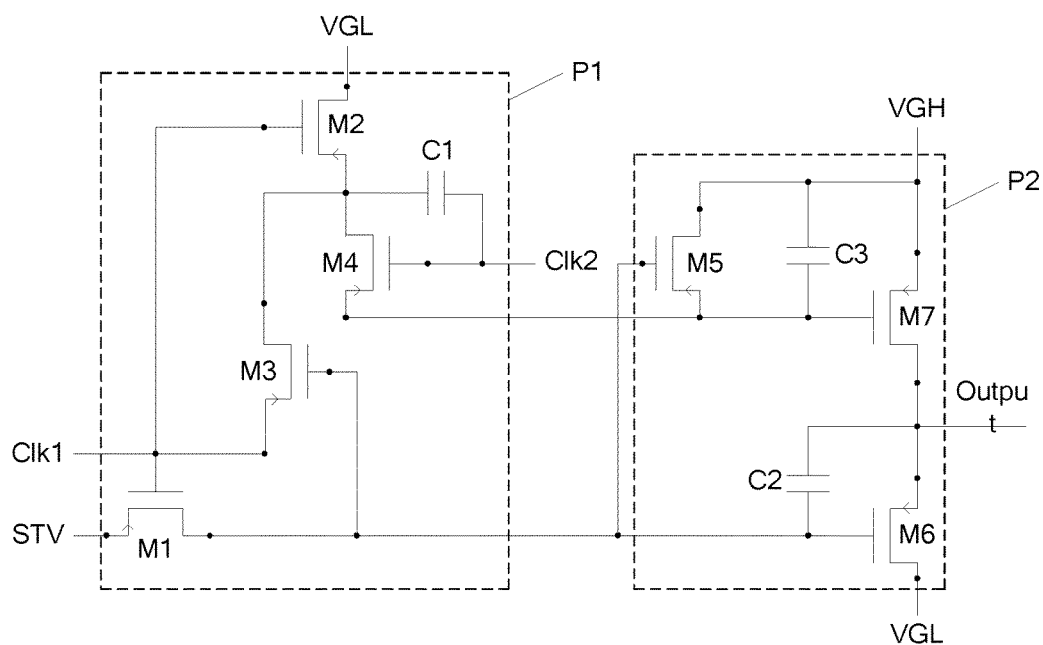
FIG. 2 is a schematic diagram of a structure of a shift register unit according to a first embodiment of the present disclosure.

FIG. 2 is a schematic diagram of a structure of a shift register unit according to a first embodiment of the present disclosure.

Please referring to FIG. 2, the shift register unit in the embodiment of the present disclosure comprises an input module P1 and an output module P2. The input module P1 can comprise a first transistor M1, a second transistor M2, a third transistor M3, a fourth transistor M4 and a first capacitor C1. The output module P2 can comprise a fifth transistor M5, a sixth transistor M6, a seventh transistor M7, a second capacitor C2 and a third capacitor C3. The input module P1 is configured to provide a selection signal to the output module P2 according to signals input by a first clock signal terminal Clk1, a second clock signal terminal Clk2 and a data carry signal terminal STV. The output module P2 is configured to select to output a high level signal or a low level signal according to the selection signal provided by the input module P1.

In the shift register unit as shown in FIG. 2, a gate of the first transistor M1 is connected to the first clock signal terminal Clk1, a gate of the second transistor M2 and a drain of the third transistor M3, a source thereof is connected to a gate of the third transistor M3, a gate of the fifth transistor M5, a gate of the sixth transistor M6 and a first terminal of the second capacitor C2, and a drain thereof is connected to the data carry signal terminal STV. A source of the second transistor M2 is connected to a low level terminal VGL, a drain thereof is connected to a source of the fourth transistor M4, a source of the third transistor M3 and the first terminal of the first capacitor C1. The drain of the third transistor M3 is connected to the first clock signal terminal Clk1. A gate of the fourth transistor M4 is connected to the second clock signal terminal Clk2 and a second terminal of the first capacitor C1, the source thereof is connected to the first terminal of the first capacitor C1, and a drain thereof is connected to a drain of the fifth transistor M5, a gate of the seventh transistor M7 and a second terminal of the third capacitor C3. The gate of the fifth transistor M5 is connected to the first terminal of the second capacitor C2 and the gate of the sixth transistor M6, a source thereof is connected to a first terminal of the third capacitor C3, a drain of the seventh transistor M7 and a high level terminal VGH, and the drain thereof is connected to the input module P1, the second terminal of the third capacitor C3 and a gate of the seventh transistor M7. The gate of the sixth transistor M6 is connected to the first terminal of the second capacitor C2, a source thereof is connected to the low level terminal VGL, and a drain thereof is connected to the second terminal of the second capacitor C2, the source of the seventh transistor M7 and the output terminal Output of the shift register unit. The gate of the seventh transistor M7 is connected to the second terminal of the third capacitor C3, the source thereof is connected to the second terminal of the second capacitor C2 and the output terminal Output of the shift register unit, and the drain thereof is connected to the first terminal of the third capacitor C3 and the high level terminal VGH.

As shown in FIG. 2, in the shift register unit provided in the present disclosure, the shift register unit only comprises one stage of circuit, and this one stage of circuit comprises 7 transistors and 3 capacitors. Compared with the shift register unit as shown in FIG. 1 which can operate normally only when two stages of circuits are arranged and the two stages of circuit comprise 12 transistors and 3 capacitors totally, the shift register unit in the present disclosure can ensure the normal operation of the shift register unit by utilizing only the one stage of circuit comprising 7 transistors and 3 capacitors, so that the structure of the circuit of the shift register unit is simplified.

It should be noted that the first transistor M1, the second transistor M2, the third transistor M3, the fourth transistor M4, the fifth transistor M5, the sixth transistor M6 and the seventh transistor M7 in the above shift register unit can be N-type transistors or P-type transistors.

Figure 3:
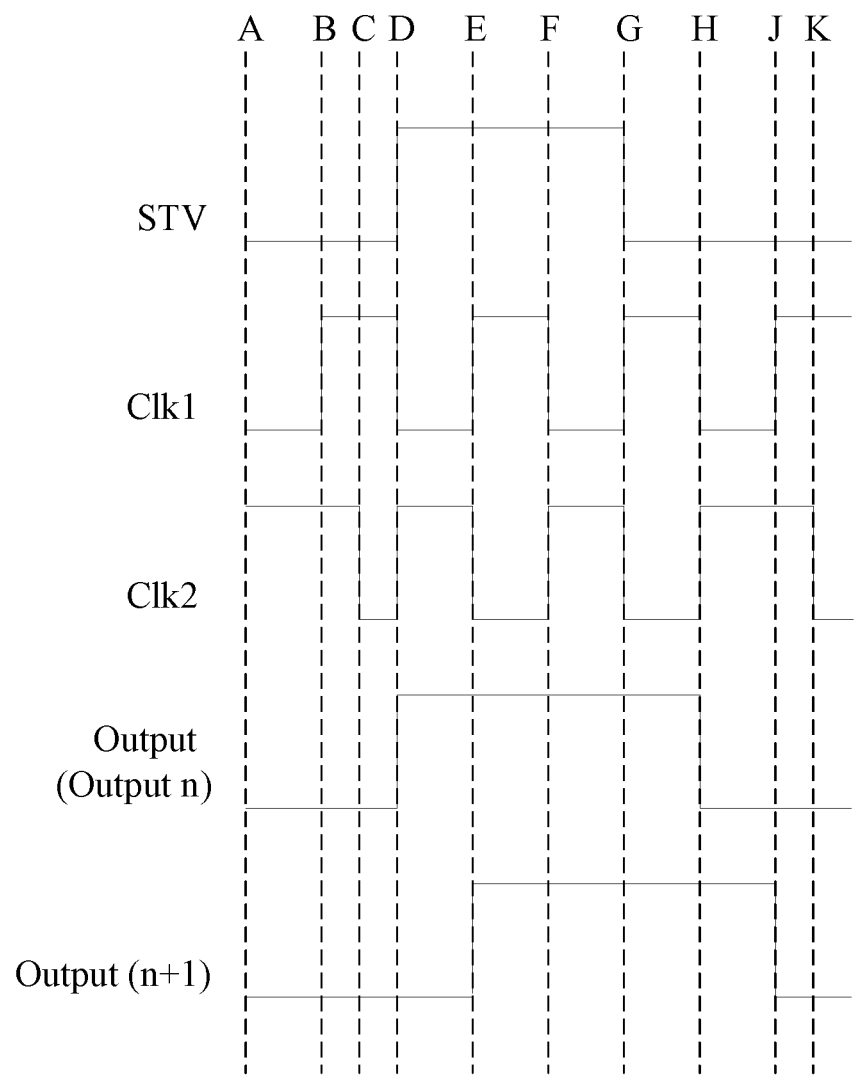
FIG. 3 is a signal timing diagram of a shift register unit according to an embodiment of the present disclosure.

FIG. 3 shows a signal timing diagram corresponding to the shift register unit. The operation process of the shift register unit will be described below by taking the first transistor M1, the second transistor M2, the third transistor M3, the fourth transistor M4, the fifth transistor M5, the sixth transistor M6 and the seventh transistor M7 being P-type transistors as an example and by referring to the signal timing diagram of FIG. 3. Herein, if a transistor is turned on, then a source and a drain of the transistor are conducted; if the transistor is turned off, then the source and drain of the transistor are not conducted.

As shown in FIG. 3, in phase A-B (i.e., first phase), both a signal of the data carry signal terminal STV and a signal of the first clock signal terminal Clk1 are low level signals, a signal of the second clock signal terminal Clk2 is a high level signal. At this time, referring to the schematic diagram of the structure of the shift register unit as shown in FIG. 2, the gate of the first transistor M1 and the gate of the second transistor M2 receive a low level signal output by the first clock signal terminal Clk1, the source and drain of the first transistor M1 are conducted, the low level signal of the data carry signal terminal STV is transmitted to the gate of the third transistor M3 through the first transistor M1, the source and drain of the third transistor M3 are conducted, the low level signal of the first clock signal terminal Clk1 is transmitted to the source of the fourth transistor M4 through the third transistor M3 and charges the first capacitor C1; the source and drain of the second transistor M2 are conducted, and the low level signal of the low level terminal VGL charges the first capacitor C1 through the second transistor M2; the low level signal of the data carry signal terminal STV is transmitted to the gate of the sixth transistor M6 through the first transistor M1 and charges the second capacitor C2, and the source and drain of the sixth transistor M6 are conducted; the low level signal of the data carry signal terminal STV is transmitted to the gate of the fifth transistor M5 through the first transistor M1, the source and drain of the fifth transistor M5 are conducted, the high level signal of the high level terminal VGH charges the third capacitor C3, the high level signal of the high level terminal VGH is transmitted to the gate of the seventh transistor M7 through the fifth transistor M5, the source and drain of the seventh transistor M7 are not conducted; the gate of the fourth transistor M4 receives the high level signal output by the second clock signal terminal Clk2, the source and drain of the fourth transistor M4 are not conducted, and thus the low level signal of the source of the fourth transistor M4 would not affect the high level signal of the gate of the seventh transistor M7, such that the sixth transistor M6 is turned on, the seventh transistor M7 is turned off, and the output terminal Output of the shift register unit is the low level signal.

In phase B-C (i.e., second phase), both the signal of the first clock signal terminal Clk1 and the signal of the second clock signal terminal Clk2 are high level signals, the signal of the data carry signal terminal STV is the low level signal, the gate of the first transistor M1 and the gate of the second transistor M2 receive the high level signal output by the first clock signal terminal Clk1, the source and drain of the first transistor M1 are not conducted, and the source and drain of the second transistor M2 are not conducted; since the low level signal obtained by the charging of the second capacitor C2 in phase A-B maintains acting, the gate of the third transistor M3 receives the low level signal output by the second capacitor C2, the source and drain of the third transistor M3 are conducted, and the high level signal output by the first clock signal terminal Clk1 is transmitted to the source of the fourth transistor M4 through the third transistor M3, and charges the first capacitor C1; the gate of the seventh transistor M7 receives the high level signal transmitted by the source of the fourth transistor M4, and the source and drain of the seventh transistor M7 are not conducted; the gate of the fifth transistor M5 and the gate of the sixth transistor M6 receive the low level signal output by the second capacitor C2, the source and drain of the fifth transistor M5 are conducted, the source and drain of the sixth transistor M6 are conducted, and the sixth transistor M6 is turned on continuously, such that the output terminal Output of the shift register unit is still the low level signal.

In phase C-D (i.e., third phase), the signal of the first clock signal terminal Clk1 is the high level signal, both the signal of the second clock signal terminal Clk2 and the signal of the data carry signal terminal STV are low level signals, the gate of the fourth transistor M4 receives the low level signal output by the second clock signal terminal Clk2, the source and drain of the fourth transistor M4 are conducted, the high level terminal VGH charges the third capacitor C3, the source and drain of the fourth transistor M4 are the high level signal, the gate of the seventh transistor M7 receives the high level signal of the drain of the fourth transistor M4, and the source and drain of the seventh transistor M7 are not conducted; the low level signal of the second capacitor C2 maintains acting, similar to the phase B-C, the output terminal Output of the shift register unit is still the low level signal in phase C-D.

In phase D-E (i.e., fourth phase), both the signal of the second clock signal terminal Clk2 and the signal of the data carry signal terminal STV are high level signals, the signal of the first clock signal terminal Clk1 is the low level signal, the gate of the first transistor M1 and the gate of the second transistor M2 receive the low level signal output by the first clock signal terminal Clk1, the source and drain of the first transistor M1 are conducted, and the source and drain of the second transistor M2 are conducted, and the source and drain of the second transistor M2 are conducted; the high level signal of the data carry signal terminal STV is transmitted to the gate of the third transistor M3, the gate of the fifth transistor M5 and the gate of the sixth transistor M6 through the first transistor M1, and charges the second capacitor C2, the source and drain of the third transistor M3 are not conducted, the source and drain of the fifth transistor M5 are not conducted, and the source and drain of the sixth transistor M6 are not conducted; the low level signal output by the low level terminal VGL is transmitted to the source of the fourth transistor M4 through the second transistor M2, and charges the first capacitor C1; the third capacitor C3 maintains the high level signal in phase C-D, and this high level signal is transmitted to the gate of the seventh transistor M7, and the source and drain of the seventh transistor M7 are not conducted. However, since the output terminal Output of the shift register unit has an equivalent capacitance, this equivalent capacitance makes that the output terminal Output of the shift register unit is the high level signal.

In phase E-F (i.e., fifth phase), both the signal of the first clock signal terminal Clk1 and the signal of the data carry signal terminal STV are high level signals, the signal of the second clock signal terminal Clk2 is the low level signal, the second capacitor C2 maintains the high level signal in phase D-E, the gate of the third transistor M3, the gate of the fifth transistor M5 and the gate of the sixth transistor M6 receive the high level signal output by the second capacitor C2, the source and drain of the third transistor M3 are not conducted, the source and drain of the fifth transistor M5 are not conducted, and the source and drain of the sixth transistor M6 are not conducted; the gate of the fourth transistor M4 receives the low level signal output by the second clock signal terminal Clk2, and the source and drain of the fourth transistor M4 are conducted; the first capacitor C1 makes the source of the fourth transistor M4 be the low level signal through its own bootstrapping function, so that the gate of the seventh transistor M7 is the low level signal, and the third capacitor C3 is charged by the low level signal, the source and drain of the seventh transistor M7 are turned on, and the output terminal Output of the shift register unit is the high level signal.

In phase F-G phase (i.e., sixth phase), both the signal of the second clock signal terminal Clk2 and the signal of the data carry signal terminal STV are high level signals, the signal of the first clock signal terminal Clk1 is the low level signal, the gate of the first transistor M1 and the gate of the second transistor M2 receive the low level signal output by the first clock signal terminal Clk1, the source and drain of the first transistor M1 are conducted, the source and drain of the second transistor M2 are conducted, the high level signal of the data carry signal terminal STV is transmitted to the gate of the third transistor M3, the gate of the fifth transistor M5 and the gate of the sixth transistor M6 through the first transistor M1, and charges the second capacitor C2, the source and drain of the third transistor M3 are not conducted, the source and drain of the fifth transistor M5 are not conducted, and the source and drain of the sixth transistor M6 are not conducted; the low level signal of the low level terminal is transmitted to the source of the fourth transistor M4 through the second transistor M2, and charges the first capacitor C1; the third capacitor C3 maintains the low level signal in phase E-F, and the source and drain of the seventh transistor M7 are conducted, such that the output terminal Output of the shift register unit is the high level signal.

In phase G-H (i.e., seventh phase), the signal of the first clock signal terminal Clk1 is the high level signal, both the signal of the second clock signal terminal Clk2 and the signal of the data carry signal terminal STV are low level signals, the second capacitor C2 maintains the high level signal in phase F-G, the source and drain of the sixth transistor are not conducted, the gate of the fourth transistor M4 receives the low level signal output by the second clock signal terminal Clk2, the source and drain of the fourth transistor M4 are conducted, the first capacitor C1 maintains the low level signal in phase F-G, the low level signal of the first capacitor C1 is transmitted to the gate of the seventh transistor M7 through the fourth transistor M4, and the source and drain of the seventh transistor M7 are conducted, such that the output terminal Output of the shift register unit is the high level signal.

In phase H-J, the signal of the second clock signal terminal Clk2 is the high level signal, and both the signal of the first clock signal terminal Clk1 and the signal of the data carry signal terminal STV are low level signals. The process is the same as that in phase A-B, and thus no further description is given herein.

In phase J-K, both the signal of the first clock signal terminal Clk1 and the signal of the second clock signal terminal Clk2 are high level signals, and the signal of the data carry signal terminal STV is the low level signal. The process is the same as that in phase B-C, and thus no further description is given herein.

It should be noted that in the present embodiment, a width of the high level of the signal of the output terminal Output of the shift register unit can be controlled by adjusting the width of the high level of the signal of the data carry signal terminal STV. The wider the high level of the signal of the data carry signal terminal STV is, the wider the high level of the signal of the output terminal Output of the shift register unit.

Figure 4:
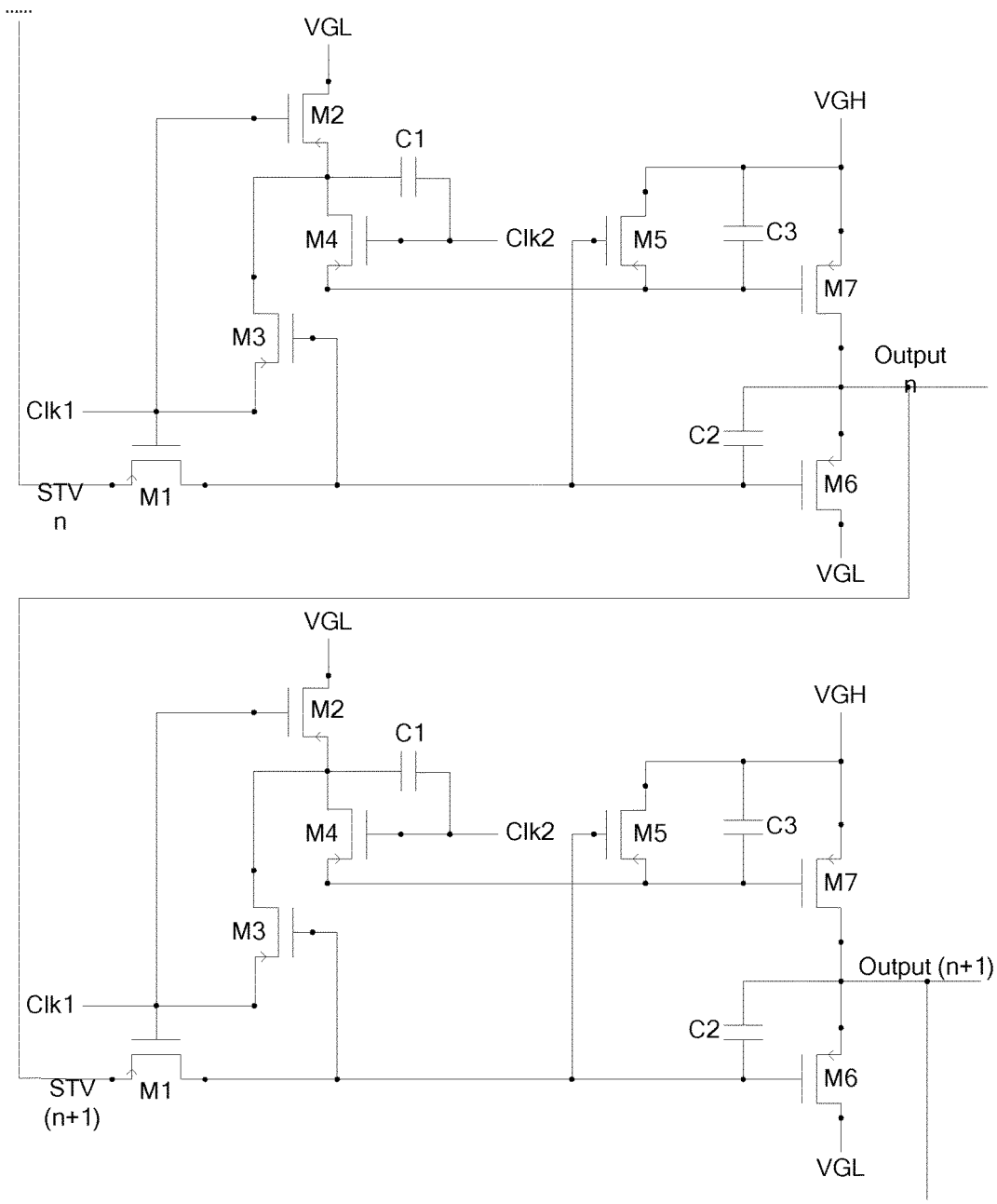
FIG. 4 is a schematic diagram of a structure of a shift register according to a second embodiment of the present disclosure.

FIG. 4 is a schematic diagram of a structure of a shift register according to a second embodiment of the present disclosure. Please referring to FIG. 4, there is further provided in the embodiment of the present disclosure a shift register, comprising multiple stages of shift register units as described above in the embodiment. Except for a first stage of shift register unit, the data carry signal terminal STV of each of remaining stages of shift register units is connected to the present stage output terminal Output of an adjacent previous stage of shift register unit; except for a last stage of shift register unit, the output terminal Output of the present stage of each of remaining stages of shift register units is connected to the data carry signal terminal STV of an adjacent next stage of shift register unit.

For example, as shown in FIG. 4, an output terminal Output n of an n-th stage of shift register unit is connected to a data carry signal terminal STV (n+1) of a (n+1)-th stage of shift register unit. Please referring to FIG. 3 for signal timings of the output terminal Output n of the n-th stage of shift register unit and the output terminal Output (n+1) of the (n+1)-th stage of shift register unit.

It should be noted that the shift register unit in the shift register has the same advantages as the shift register unit in the above embodiment, and thus no further description is given herein.

There is further provided in an embodiment of the present disclosure a display apparatus, comprising the shift register in the above embodiment. The shift register in the display apparatus has the same advantages as the shift register in the above embodiment, and thus no further description is given herein. Exemplarily, the display apparatus can be any product or elements having the function of displaying such as an organic light-emitting diode display panel, an electronic paper, a mobile phone, a tablet computer, a television set, a display, a notebook computer, a digital photo frame, a navigator, etc.

In the above description of the implementations, specific feature, structure, material or characteristic can be combined in an appropriate manner in one or more embodiments or examples.

The above descriptions are just specific implementations of the present disclosure. However, the protection scope of the present disclosure is not limited thereto, and any alternation or replacement that can be easily conceived by those skilled in the art who are familiar with the technical field within the technical scope of the present disclosure shall be deemed as falling into the protection scope of the present disclosure. Therefore, the protection scope of the present disclosure shall be subjected to the protection scope of the appended claims.

The present application claims the priority of a Chinese patent application No. 201510263844.X filed on May 21, 2015. Herein, the content disclosed by the Chinese patent application is incorporated in full by reference as a part of the present disclosure.

What is claimed is:

1. A shift register unit, comprising:
    an input module (P1), connected to a first clock signal terminal (Clk1), a second clock signal terminal (Clk2) and a data carry signal terminal (STV) and configured to provide a selection signal according to signals input by the first clock signal terminal (Clk1), the second clock signal terminal (Clk2) and the data carry signal terminal (STV);
    an output module (P2), connected to a high level terminal (VGH), a low level terminal (VGL), and an output terminal (Output) of the shift register unit and configured to select to output a high level signal or a low level signal at the output terminal (Output) according to the selection signal provided by the input module (P1),
    wherein the input module comprises a first transistor, a second transistor, a third transistor, a fourth transistor and a first capacitor, the output module comprises a fifth transistor, a sixth transistor, a seventh transistor, a second capacitor, and a third capacitor, a gate of the first transistor is connected to the first clock signal terminal, a gate of the second transistor and a drain of the third transistor, a source thereof is connected to a gate of the third transistor, a gate of a fifth transistor, a gate of the sixth transistor and a first terminal of a second capacitor, and a drain thereof is connected to the data carry signal terminal; a source of the second transistor is connected to the low level terminal, and a drain thereof is connected to a source of the fourth transistor, a source of the third transistor and a first terminal of the first capacitor; the drain of the third transistor is connected to the first clock signal terminal; a gate of the fourth transistor is connected to the second clock signal terminal and a second terminal of the first capacitor, a source thereof is connected to the first terminal of the first capacitor, and a drain thereof is connected to a drain of the fifth transistor, a gate of a seventh transistor and a second terminal of a third capacitor.

2. The shift register unit according to claim 1, wherein the gate of the fifth transistor is connected to the first terminal of the second capacitor and the gate of the sixth transistor, a source thereof is connected to a first terminal of the third capacitor, a drain of the seventh transistor and the high level terminal, and the drain thereof is connected to the second terminal of the third capacitor and the gate of the seventh transistor; the gate of the sixth transistor is connected to the first terminal of the second capacitor, a source thereof is connected to the low level terminal, and a drain thereof is connected to a second terminal of the second capacitor, a source of the seventh transistor and the output terminal of the shift register unit; the gate of the seventh transistor is connected to the second terminal of the third capacitor, the source thereof is connected to the second terminal of the second capacitor and the output terminal of the shift register unit, and the drain thereof is connected to the first terminal of the third capacitor and the high level terminal.

3. The shift register unit according to claim 1, wherein the first transistor, the second transistor, the third transistor, the fourth transistor, the fifth transistor, the sixth transistor and the seventh transistor are N-type transistors or P-type transistors.

4. A driving method of a shift register unit according to claim 1, comprising:
    providing the selection signal, by an input module, according to signals input by a first clock signal terminal, a second clock signal terminal and a data carry signal terminal; and
    selecting to output a high level signal or a low level signal at an output terminal of the shift shifter unit according to the selection signal provided by the input module.

5. The driving method according to claim 4, comprising:
    in a first phase, both a signal of a data carry signal terminal and a signal of a first clock signal terminal are low level signals, a signal of a second clock signal terminal is a high level signal, and the signal of the data carry signal terminal and the signal of the first clock signal terminal turn on a sixth transistor and charge a second capacitor, such that an output of the shift register unit is a low level signal;
    in a second phase, both the signal of the first clock signal terminal and the signal of the second clock signal terminal are high level signals, the signal of the data carry signal terminal is the low level signal, and the second capacitor provides the low level signal maintained in the first phase to the sixth transistor, and the sixth transistor is turned on, such that the output of the shift register unit is the low level signal;
    in a third phase, the signal of the first clock signal terminal is the high level signal, the both the signal of the second clock signal terminal and the signal of the data carry signal terminal are low level signals, a high level signal of a high level terminal charges a third capacitor, and the second capacitor provides the low level signal maintained in the second phase to the sixth transistor, and the sixth transistor is turned on, such that the output of the shift register unit is the low level signal;
    in a fourth phase, both the signal of the second clock signal terminal and the signal of the data carry signal terminal are high level signals, the signal of the first clock signal terminal is the low level signal, the signal of the data carry signal terminal and the signal of the first clock signal terminal turn off the sixth transistor and charges the second capacitor, the third capacitor provides the high level signal maintained in the third phase to a seventh transistor and the seventh transistor is turned off, and an equivalent capacitance of the output terminal of the shift register unit makes that the output of the shift register unit is the high level signal;
    in a fifth phase, both the signal of the first clock signal terminal and the signal of the data carry signal terminal are high level signals, the signal of the second clock signal terminal is the low level signal, the second capacitor provides the high level signal maintained in the fourth phase to the sixth transistor, and the sixth transistor is turned off, a bootstrapping function of a first capacitor makes that a source of a fourth transistor is the low level signal, the fourth transistor is turned on to charge the third capacitor, and the seventh transistor is turned on, such that the output of the shift register unit is the high level signal;

in a sixth phase, both the signal of the second clock signal terminal and the signal of the data carry signal terminal are high level signals, the signal of the first clock signal terminal is the low level signal, the signal of the data carry signal terminal and the signal of the first clock signal terminal turn off the sixth transistor, the signal of the data carry signal terminal charges the second capacitor through a first transistor, the low level terminal charges the first capacitor through a second transistor, the third capacitor provides the low level signal maintained in the fifth phase to the seventh transistor, and the seventh transistor is turned on, such that the output of the shift register is the high level signal; and in a seventh phase, the signal of the first clock signal terminal is the high level signal, both the signal of the second clock signal terminal and the signal of the data carry signal terminal are low level signals, the second capacitor provides the high level signal maintained in the sixth phase to the sixth transistor, and the sixth transistor is turned off, the low level signal of the second clock signal terminal turns on the fourth transistor, the first capacitor provides the low level signal maintained in the sixth phase to the seventh transistor, and the seventh transistor is turned on, such that the output of the shift register unit is the high level signal.

6. A shift register, comprising multiple stages of the shift register unit according to claim 1;
except for a first stage of shift register unit, a data carry signal terminal of each of remaining stages of shift register units is connected to a present stage output terminal of an adjacent previous stage of shift register unit;
except for a last stage of shift register unit, the output terminal of the present stage of each of remaining stages of shift register units is connected to a data carry signal terminal of an adjacent next stage of shift register unit.

7. A display apparatus, comprising the shift register according to claim 6.

8. The shift register according to claim 6, wherein the gate of the fifth transistor is connected to the first terminal of the second capacitor and the gate of the sixth transistor, a source thereof is connected to a first terminal of the third capacitor, a drain of the seventh transistor and the high level terminal, and the drain thereof is connected to the second terminal of the third capacitor and the gate of the seventh transistor; the gate of the sixth transistor is connected to the first terminal of the second capacitor, a source thereof is connected to the low level terminal, and a drain thereof is connected to a second terminal of the second capacitor, a source of the seventh transistor and the output terminal of the shift register unit; the gate of the seventh transistor is connected to the second terminal of the third capacitor, the source thereof is connected to the second terminal of the second capacitor and the output terminal of the shift register unit, and the drain thereof is connected to the first terminal of the third capacitor and the high level terminal.

9. The shift register according to claim 6, wherein the first transistor, the second transistor, the third transistor, the fourth transistor, the fifth transistor, the sixth transistor and the seventh transistor are N-type transistors or P-type transistors.

10. The display apparatus according to claim 7, wherein the gate of the fifth transistor is connected to the first terminal of the second capacitor and the gate of the sixth transistor, a source thereof is connected to a first terminal of the third capacitor, a drain of the seventh transistor and the high level terminal, and the drain thereof is connected to the second terminal of the third capacitor and the gate of the seventh transistor; the gate of the sixth transistor is connected to the first terminal of the second capacitor, a source thereof is connected to the low level terminal, and a drain thereof is connected to a second terminal of the second capacitor, a source of the seventh transistor and the output terminal of the shift register unit; the gate of the seventh transistor is connected to the second terminal of the third capacitor, the source thereof is connected to the second terminal of the second capacitor and the output terminal of the shift register unit, and the drain thereof is connected to the first terminal of the third capacitor and the high level terminal.

11. The display apparatus according to claim 7, wherein the first transistor, the second transistor, the third transistor, the fourth transistor, the fifth transistor, the sixth transistor and the seventh transistor are N-type transistors or P-type transistors.

* * * * *